(12) United States Patent
Tamada et al.

(10) Patent No.: US 6,395,456 B1
(45) Date of Patent: May 28, 2002

(54) SEMICONDUCTOR DEVICE ACHIEVING HIGHER INTEGRATION, METHOD OF MANUFACTURING THEREOF, AND METHOD OF FORMING RESIST PATTERN USED THEREFOR

(75) Inventors: Naohisa Tamada; Yoshiaki Yamada, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/342,895

(22) Filed: Jun. 29, 1999

(30) Foreign Application Priority Data

Jan. 12, 1999 (JP) ............................ 11-005498

(51) Int. Cl.$^7$ ................................ G03F 7/22
(52) U.S. Cl. ............... 430/312; 430/311; 430/394; 430/396; 430/397
(58) Field of Search ................. 430/311, 312, 430/394, 396, 397

(56) References Cited

U.S. PATENT DOCUMENTS

| | | | | |
|---|---|---|---|---|
| 5,811,222 A | * | 9/1998 | Gardner | 430/312 |
| 5,837,426 A | * | 11/1998 | Tseng | 430/311 |
| 5,972,567 A | * | 10/1999 | Hu | 430/312 |
| 6,187,486 B1 | * | 2/2001 | Lai | 430/22 |
| 6,248,508 B1 | * | 6/2001 | Murooka et al. | 430/394 |

FOREIGN PATENT DOCUMENTS

| | | |
|---|---|---|
| JP | 1-258419 | 10/1989 |
| JP | 5-206001 | 8/1993 |
| JP | 5-259018 | 10/1993 |

* cited by examiner

Primary Examiner—Mark F. Huff
Assistant Examiner—Nicole Barreca
(74) Attorney, Agent, or Firm—McDermott, Will & Emery

(57) ABSTRACT

A semiconductor device achieving higher integration without deterioration of electrical characteristics thereof, a method of manufacturing the semiconductor device, and a method of forming a resist pattern used for that can be obtained.

According to the method of forming a resist pattern used for the method of manufacturing a semiconductor device, light is directed via a mask onto a resist film surface formed on a substrate to project a first optical image having a width equal to or less than the wavelength of the light onto the resist surface. The mask is shifted relative to the substrate. Via the shifted mask, light is directed onto the resist film surface to project a second optical image having a width equal to or less than the wavelength of the light onto the resist surface such that the second optical image partially overlaps faith a region where the first optical image is projected.

16 Claims, 15 Drawing Sheets

SEMICONDUCTOR DEVICE ACHIEVING HIGHER INTEGRATION, METHOD OF MANUFACTURING THEREOF, AND METHOD OF FORMING RESIST PATTERN USED THEREFOR

BACKGROUND OF THE INVENTION

1. Field of the Invention

The present invention relates to semiconductor devices and methods of manufacturing the semiconductor devices as well as methods of forming resist patterns and exposure systems used therefor. The invention more particularly relates to semiconductor devices achieving higher integration without deterioration in electrical characteristics thereof and methods of manufacturing the semiconductor devices, as well as methods of forming resist patterns and exposure systems used therefor.

2. Description of the Background Art

Demand for reduced scale and increased integration of semiconductor devices represented by the semiconductor memory device or the like is increasing nowadays. In order to attain such decrease and improvement in scale and integration respectively, the semiconductor has a spacing between interconnection lines that is approximately equal to or smaller than the wavelength of exposure light for the photolithography process in the step of fabricating the interconnection lines. If a through hole is formed in an interlayer insulating film such that the hole is located between the interconnection lines without contacting with the interconnection lines, the through hole should have its diameter smaller than the distance between the interconnection lines. In other words, the through hole having its diameter smaller than the wavelength of the exposure light must be made. For example, if KrF excimer laser (wavelength 248 nm) is employed as the exposure light, a through hole with a diameter of about 200 nm is required. If i-ray (wavelength 365 nm) is employed, a through hole with a diameter of about 300 nm is required.

The through hole is used for electrically connecting an underlying conductive region and an overlying interconnection line. The overlying interconnection line should be formed to overlap the through hole. However. considering the overlay accuracy of a photolithography used for forming the overlying interconnection line, the diameter of the through hole preferably has a size defined by taking it into account at least the width and the margin (tolerance) of pattern position accuracy of the overlying a interconnection line, in order to superimposing the overlying interconnection line surely on the through hole. The through hole then needs the diameter significantly greater than the wavelength of the exposure light.

A semiconductor device as shown in FIG. 21 has a structure which satisfies the two requirements above, for example. FIG. 21 is a plan view illustrating the semiconductor device associated with the present invention.

Referring to FIG. 21, lower-level interconnection lines 115a to 115e such as gate electrodes are formed on a semiconductor substrate (not shown). A conductive region (not shown) is formed between lower-level interconnection lines 115a to 115e at a main surface of the semiconductor substrate. An interlayer insulating film (not shown) is formed on lowerlevel interconnection lines 115a to 115e. Contact holes 116a to 116f are formed in the interlayer insulating film in a region between lower-level interconnection lines 115b and 115c and a region between lower-level interconnection lines 115d and 115e. Upper-level interconnection lines 117a to 117c are formed on the interlayer insulating film and in contact holes 116a to 116f extending in a direction almost. perpendicular to the direction in which lower-level interconnection lines 115a to 115e extend.

The spacing between lower-level interconnection lines 115a to 115e is approximately equal to or smaller than the wavelength of exposure light used for generating lower-level interconnection lines 115a to 115e. Considering this, the shortest, distance across each of contact holes 116a to 116f (minor axis) should be smaller than the wavelength of the exposure light.

Preferably, the longest distance across contact holes 116a to 116f each (major axis) is greater than the combined length of the line width of upper-level interconnection lines 117a to 117c each and a margin of pattern position accuracy ΔM. This arrangement is made for surely making contact between upper-level interconnection lines 117a to 117c and the conductive region on the semiconductor substrate via contact holes 116a to 116f even if the positions of upper-level interconnection lines 117a to 117c change due to varying factors in manufacture such as an overlay error of a mask.

A mask pattern illustrated in FIG. 22 is used for making such contact holes 116a to 116f. FIG. 22 illustrates the mask pattern used for generating contact holes 116a to 116f shown in FIG. 21.

Referring to FIG. 22, a mask pattern 110 is generated at a lightblocking film 109. Mask pattern 110 has a width Wm4 and a height Hm4. If mask pattern 110 is for a reduction exposure step using a stepper, the size of mask pattern 110 is about five times larger than that of a resist pattern formed at a resist film on the semiconductor substrate. For an exposure system such as a scan type having a different reduction ratio of 4 to 1, the size of the mask pattern is about four times larger than, or inverse of the reduction ratio times larger than that of the resist pattern.

FIG. 23 illustrates a resist pattern to be formed by using the mask pattern shown in FIG. 22. Referring to FIG. 23, a resist pattern 112a having a width W3 and a height H3 is formed at a resist film 11.

If resist pattern 112a to be formed has the width W3 which is sufficiently greater than the wavelength of the exposure light, the ratio between the width W3 and height H3 of resist pattern 112a is almost close to the ratio between the width Wm4 and the height Hm4 of mask pattern 110 shown in FIG. 22. Accordingly, resist pattern 112a similar to an ellipse as shown in FIG. 23 is obtained. Referring again to FIG. 23, if the distance HS between resist pattern 112a to be formed and another resist pattern adjacent thereto is sufficiently greater than the wavelength of the exposure light, the shape, size, position and the like of resist pattern 112a can easily be corrected.

However, if the width W3 of resist pattern 112a to be formed is smaller than the wavelength of the exposure light, the ratio of a height H4 to a width W4 of a resist pattern 112b is smaller than the ratio of the height Hm4 to the width Wm4 of mask pattern 110 of the mask used for the exposure step as shown in FIG. 24. As a result, the two-dimensional shape of thus obtained resist pattern 112b becomes similar to a circle as shown in FIG. 24. FIG. 24 illustrates the resist pattern generated by using the mask pattern shown in FIG. 22 when the shortest distance across the resist pattern is smaller than the wavelength of the exposure light.

In such a case, resist pattern 112a as shown in FIG. 23 is not obtained. and accordingly, it is difficult to form contact holes 116a to 116f each having the sufficient longest distance across the contact hole. When upper-level interconnection lines 117a to 117c are formed, if the longest distance across contact holes 116a to 116f each is not enough, the positions of upper-level interconnection lines 117a to 117c and of contact holes 116a to 116f could not match.

A problem consequently arises is that electrical connection of the conductive region on the semiconductor substrate with upper-level interconnection lines 117a to 117c is impossible. This problem causes deterioration of electrical characteristics of the semiconductor device. For example, a circuit in the semiconductor device does not operate correctly. A problem thus generated is reduction in the yield of the semiconductor device.

In order to avoid decrease in the height H4 of resist pattern 112b as shown in FIG. 24, a mask pattern shown in FIG. 25 can be used. FIG. 25 illustrates another mask pattern associated with the present invention. Referring to FIG. 25, a mask pattern 110a has its height Hm5 greater than the height Hm4 of mask pattern 110 in FIG. 22. However, even if the mask pattern as shown in FIG. 25 is used, resist patterns adjacent to each other are connected via a joint 140 to generate a large resist pattern 112c as shown in FIG. 26 when contact holes 116a to 116f are to be produced to be adjacent to each other as shown in FIG. 21. In other words, if the distance HS between resist pattern 112a (see FIG. 23) to be formed and another resist pattern adjacent thereto is smaller than the wavelength of the exposure light, resist pattern 112c as shown in FIG. 26 is consequently produced, leading to difficulty in making fine adjustment to the shape, position, and the like of the resist pattern. FIG. 26 illustrates the resist pattern generated by using the mask pattern shown in FIG. 25.

It is still difficult to make contact holes 116a to 116f illustrated in FIG. 21 by increasing the height Hm5 of the mask pattern as shown in FIG. 25.

As heretofore described, the conventional method of forming a resist pattern has difficulty in forming a resist pattern having the shortest distance which is smaller than the wavelength of exposure light and the longest distance which is greater than the wavelength of exposure light. Therefore, to generate such contact holes 116a to 116c as illustrated in FIG. 21 is difficult.

Further, the demand for enhanced integration and smaller scale of a semiconductor device requires that, not only the contact hole but a conductive region 135 formed at the main surface of the semiconductor substrate, as shown in FIG. 27, has a two-dimensional shape with its height H5 smaller than the wavelength of exposure light used for generating conductive region 135, and its width W5 sufficiently greater than the exposure light. FIG. 27 is a plan view illustrating a semiconductor device associated with the present invention. Referring to FIG. 27, by densely arranging conductive regions 135 in the direction of the height 115, elements of the semiconductor device can be highly integrated.

Referring to FIG. 27 again, contact holes 136a and 136b are formed on conductive region 135 for making electrical contact with overlying interconnection lines and the like. Further, gate electrodes 118c to 118g are formed on the semiconductor substrate. The width W5 of conductive region 135 should be sufficiently large for generating contact holes 136a and 136b as well as gate electrodes 118f and 118g on conductive region 135.

In formation of conductive region 135, as shown in FIG. 28, a silicon nitride film (not shown) functioning as a protection film in thermal oxidation is deposited on a main surface of a semiconductor substrate 137, and a resist pattern 111a is then formed on a region which becomes conductive region 135 (see FIG. 27l). FIG. 28 illustrates the resist pattern used for fabricating the semiconductor device shown in FIG. 27. Resist pattern 111a should have its height H5 smaller than the wavelength of exposure light and its width W5 which is sufficiently larger than the wavelength of the exposure light as described above.

However, a problem similar to that pointed out regarding the semiconductor device having contact holes 116a to 116f (see FIG. 21) arises. Specifically, when the conventional method of forming a resist pattern is employed to form such resist pattern 111a as shown in FIG. 28, a width W6 corresponding to the longer side of the resist pattern 111a becomes smaller than the width W5 of the resist pattern which is originally required as shown in FIG. 29. FIG. 29 illustrates the resist pattern where the shorter side is smaller than the wavelength of exposure light.

It is therefore difficult to form conductive region 135 as shown in FIG. 27, while achieving higher integration.

SUMMARY OF THE INTENTION

One object of the present invention is to provide a semiconductor device achieving higher integration without deteriorating electrical characteristics thereof.

Another object of the present invention is to provide a method of manufacturing a semiconductor device achieving higher integration without deteriorating electrical characteristics thereof.

Still another object of the present invention is to provide a method of forming a resist pattern used for the method of manufacturing a semiconductor device achieving higher integration without deteriorating electrical characteristics thereof.

Further object of the present invention is to provide an exposure system used for the method of manufacturing a semiconductor device achieving higher integration without deteriorating electrical characteristics thereof.

According to one aspect of the invention regarding a method of forming a resist pattern, light is directed via a mask onto a surface of a resist film formed on a substrate to project a first, optical image having a width which is equal to or less than the wavelength of the light onto the surface of the resist film. The mask is shifted relative to the substrate. Light is directed via the shifted mask onto the surface of the resist film to project a second optical image having a width which is equal to or less than the wavelength of the light onto the surface of the resist film such that the second optical image partially overlaps with a region where the first optical image is projected.

Accordingly, the shortest distance across an optical image which is finally produced by the first and second optical images can be made smaller than the wavelength of the light. Adjustment to direction and distance of the shift of the mask enables the longest distance of the optical image to be sufficiently greater than the wavelength of the light. A long and narrow resist pattern having a shortest distance smaller than the wavelength of light and a longest distance greater than the wavelength of light can precisely be generated, which is difficult if one exposure operation as employed by a conventional exposure process is applied. By use of such a long and narrow resist pattern, a semiconductor element structure such as a contact hole and a conductive region having a width smaller than the wavelength of light can be produced. As a result, higher integration of the semiconductor device is achieved.

By adjustment to the position and size of a portion where regions on which the first and second optical images are respectively projected overlap with each other, the dimension of the longest distance of the finally produce d resist, pattern can easily be adjusted. Accordingly, a resist pattern having a shortest distance smaller than the wavelength of light and a longest distance having an arbitrary dimension can be obtained.

By adjustment to direction and distance of the shift of the mask, not only the long and narrow resist pattern but a resist pattern having an arbitrary shape can be generated.

According to the one aspect of the invention described above regarding the method of forming a resist pattern, a step may be provided of developing the resist film to generate a resist pattern having a width equal to or less than the wavelength of light in regions where the first and second optical images are respectively projected and a region where the first and second optical images are projected overlapping with each other. The length of the resist pattern in a direction almost perpendicular to the direction of the width may be greater than the wavelength of light.

In this case, a resist pattern having a width (shortest distance) smaller than the wavelength of light and a length (longest distance) greater than the wavelength of light in a direction almost perpendicular to the direction of the width can be generated easily. If this resist pattern is used for forming a contact hole, for example, the degree of integration of semiconductor element structures such as the contact hole can be improved in the direction of the shortest distance of the resist pattern.

An interconnection line can be formed surely on a semiconductor element structure such as a contact hole generated by using the resist pattern, by making the semiconductor element structure into a long and narrow shape, even if the pattern position accuracy of the interconnection line formed to extend in a direction almost identical to the direction of the shortest distance is not satisfactory. Consequently, such a problem as defect of connection and disconnection of lines in a semiconductor device due to mismatch of the position of the semiconductor element structure and that of the interconnection line can be prevented Accordingly, deterioration of electrical characteristics of the semiconductor device caused by the such defect in connection can be avoided.

Prevention of deterioration of electrical characteristics as well as enhanced integration of the semiconductor device are thus possible.

According to the one aspect of the invention described above regarding the method of forming a resist pattern, the step of shifting the mask relative to the substrate may include a step of directing light onto the surface of the resist film via the mask while the mask is relatively shifted.

In this case, the method of forming a resist pattern of the invention is easily implemented particularly for an exposure system of the scan type.

According to the one aspect regarding the method of forming a resist pattern, the resist film may be the positive type.

According to the one aspect regarding the method of forming a resist pattern. the resist pattern may be a hole pattern.

According to the one aspect regarding the method of forming a resist pattern, the hole pattern may have a two-dimensional shape close to an ellipse.

In this case, a contact hole having an almost elliptical two-dimensional shape can easily be generated using the elliptical hole pattern. If the shortest distance across the contact hole is made smaller than the wavelength of light used for exposure, the degree of integration of contact holes can be enhanced in the direction of the shortest distance of the contact hole.

If the longest distance across the contact hole is made sufficiently greater than the wavelength of light, an interconnection line can be produced surely on the contact hole to extend in a direction almost perpendicular to the longest distance of the contact hole, even if the pattern position accuracy of the interconnection line is not satisfactory. Consequently, a problem such as electrically insufficient connection (defect of connection) via the contact hole between the interconnection line and a conductive region under the contact hole, due to mismatch of the positions of the contact hole and the interconnection line never occurs. It is thus possible to prevent deterioration of electrical characteristics of the semiconductor device due to such defective connection.

Accordingly, deterioration of electrical characteristics of the semiconductor device can be prevented and integration of the semiconductor device can be improved.

According to the one aspect regarding the method of forming a resist pattern, the resist film may be the negative type.

According to the one aspect regarding the method of forming a resist pattern, the resist pattern may be used for forming a conductive region.

According to the one aspect regarding the method of forming a resist pattern, the conductive region may have a two-dimensional shape which is almost rectangular.

In this case, a two-dimensionally rectangular conductive region having the shorter side and the longer side respectively smaller and greater than the wavelength of light. can be produced easily. Such conductive regions can be formed densely in the direction of the shorter side compared with the conventional device, and thus integration of the semiconductor device is easy.

Contact holes, interconnection lines functioning as electrodes, and the like may be formed on the conductive region. Even if the pattern position accuracy of the contact holes and the like is not satisfactory, the contact holes and interconnection lines can be produced surely on the conductive region since the longer side of the conductive region has a sufficient size which is longer than the wavelength of light. As a result, such a problem as connection defect in a circuit of the semiconductor device due to mismatch of the positions of the contact hole and the conductive region can be avoided. Accordingly, deterioration of electrical characteristics of the semiconductor device caused by the connection defect can be prevented.

Prevention of the deterioration of electrical characteristics as well as higher integration of the semiconductor device are thus achieved.

According to another aspect of the invention regarding a method of manufacturing a semiconductor device, the method of forming a resist pattern of the above-described one aspect is used.

In this case, using a resist pattern having a width (shortest distance) smaller than the wavelength of light and a length (longest distance) in a direction almost perpendicular to the direction of the width that is greater than the wavelength of light can be used for producing a semiconductor element structure such as a contact hole. Accordingly, in the direction of the shortest distance of the resist pattern, the degree of integration of semiconductor element structures such as contact holes can be enhanced.

Even if the pattern position accuracy of an interconnection line formed to extend in the direction almost identical to the direction of the shortest distance is not satisfactory, the interconnection line can be formed surely on the semiconductor element structure such as the contact hole generated by using this resist pattern, by forming the semiconductor element structure into a long and narrow shape. As a result, it is possible to prevent, a problem such as defective connection and disconnection of lines in the semiconductor device due to mismatch of the positions of the semiconductor element structure and the interconnection line. Accordingly, deterioration of electrical characteristics of the semiconductor device due to this defective connection or the like can be prevented.

Prevention of electrical characteristics as well as higher integration of a semiconductor device are thus possible.

According to still another aspect of the invention regarding an exposure system, the exposure system includes a substrate support member, a mask, and light-directing means. The substrate support member supports a substrate where a resist film is formed. The light-directing means direct light onto the resist film via the mask while shifting the mask relative to the substrate to project an optical image having a width equal to or less than the wavelength of light onto the resist film.

The exposure system of the invention can thus easily implement the method of forming a resist pattern according to the above one aspect of the invention.

According to a further aspect of the invention regarding a semiconductor device, the semiconductor device includes a semiconductor substrate and a coating film. The coating film is deposited on the semiconductor substrate and has a hole. The shortest distance across the hole is equal to or less than the wavelength of exposure light used in a photolithography process for making the hole. The longest distance across the hole is greater than the wavelength of the exposure light.

In the direction of the shortest distance, the number of holes can be increased compared with the conventional device since the shortest distance across the hole is smaller than the wavelength of exposure light. As a result, when the holes are utilized as contact holes or the like of the semiconductor device, the degree of integration of semiconductor element structures can be enhanced by the increased number of contact holes. Accordingly, the degree of integration of the semiconductor device can be improved.

When an interconnection line is formed on the hole to extend in a direction almost perpendicular to the longest distance of the hole, the interconnection line can be formed surely on the hole since the longest distance across the hole has a sufficient size which is greater than the wavelength of exposure light, even if the pattern position accuracy of the interconnection line is not satisfactory. As a result, defective connection of the interconnection line with a conductive region formed under the hole due to mismatch of positions of the hole and the interconnection line can be prevented. Deterioration of electrical characteristics of the semiconductor device due to defective connection can thus be prevented.

Prevention of deterioration of electrical characteristics and higher integration of the semiconductor device are accordingly possible.

According to the further aspect described above concerning the semiconductor device, the semiconductor device may further include an interconnection line formed on the hole to extend in a direction almost perpendicular to the longest distance of the hole. The coating film may be an insulating film, and the longest distance may be greater than the sum of the line width of the interconnection line and the length of the margin of the pattern position accuracy of the interconnection line.

In this case, even if the position of the interconnection line formed on the hole varies to some extent, the interconnection line can be formed to overlap the hole. Accordingly, electrical connection between the interconnection line and a conductive region formed under the hole can surely be made.

According to a still further aspect of the invention regarding a semiconductive device, the semiconductor device includes a semiconductor substrate and a conductive region. The conductive region is formed on the substrate. The shortest distance across a two-dimensional shape of the conductive region is equal to or less than the wavelength of exposure light used in a photolithography process for producing the conductive region. The longest distance across the two-dimensional shape is greater than the wavelength of the exposure light.

The shortest distance across the conductive region is thus smaller than the wavelength of exposure light, so that the number of the conductive regions in the direction of the shortest distance can be increased compared with the conventional semiconductor device including the conductive region with its shortest distance greater than the wavelength of exposure light. As a result, the degree of integration of the semiconductor device can be improved.

The longest distance across the conductive region is thus greater than the wavelength of exposure light, so that when a contact hole, an interconnection line, or the like is formed on the conductive region, the contact hole or the like can be formed surely on the conductive region. Consequently, a problem such as defective connection or disconnection of lines due to mismatch of the positions of the conductive region and the contact hole or the like can be prevented. Deterioration of electrical characteristics of the semiconductor device due to the defective connection or the like can be prevented accordingly.

Prevention of deterioration of electrical characteristics as well as higher integration of the semiconductor device are thus possible.

According to the still further aspect regarding the semiconductor device, the semiconductor device may include an interconnection line formed on the conductive region to extend in a direction almost perpendicular to the longest distance. The longest distance may be greater than the sum of the line width of the interconnection line and the length of the margin of pattern position accuracy of the interconnection line.

In this case, even if the position of the interconnection line varies, the interconnection lines can surely be formed on the conductive region. As a result, prevention of defective connection due to mismatch of the positions of the interconnection line and the conductive region in the semiconductor device is surely possible. Deterioration of electrical characteristics of the semiconductor device due to the defective connection can be prevented accordingly.

According to one further aspect of the invention regarding a semiconductor device, the semiconductor device includes a semiconductor substrate, and a coating film formed on the semiconductor substrate and having first and second holes. The shortest distance across the first and second holes each is equal to or smaller than the wavelength of the exposure light used in a photolithography process step for generating the first and second holes. The longest distance across the first and second holes each is greater than the wavelength of the exposure light. The distance between the first and second holes is equal to or less than the wavelength of the exposure light. In the photolithography process step for generating the first and second holes, an exposure step is performed by moving a mask having a pattern formed thereon for producing the first and second holes relatively to and in parallel with the semiconductor substrate.

In the direction of the shortest distance, the number of holes can be increased compared with the conventional device since the shortest distance across the hole is smaller than the wavelength of exposure light. The number of holes per unit area can further be increased since the distance between the first and second holes is equal to or smaller than the wavelength of the exposure light. As a result, when the holes are utilized as contact holes or the like of the semiconductor device, the degree of integration of semiconductor element structures can be enhanced by the increased number of contact holes. Accordingly, the degree of integration of the semiconductor device can be improved.

When an interconnection line is formed on the hole to extend in a direction almost perpendicular to the longest distance of the hole, the interconnection line can be formed surely on the hole since the longest distance across the hole has a sufficient size which is greater than the wavelength of exposure light, even if the pattern position accuracy of the interconnection line is not satisfactory. As a result, defective connection of the interconnection line with a conductive region formed under the hole due to mismatch of positions of the hole and the interconnection line can be prevented. Deterioration of electrical characteristics of the semiconductor device due to defective connection can thus be prevented.

Prevention of deterioration of electrical characteristics and higher integration of the semiconductor device are accordingly possible.

According to the one further aspect of the invention, the semiconductor device may further include an interconnection line formed on at least one of the first and second holes and extending in a direction almost perpendicular to the longest distance across the holes each. The coating film may be an insulating film, and the longest distance may be greater than the sum of the line width of the interconnection line and the length of the margin of the pattern position accuracy of the interconnection line.

In this case, even if the position of the interconnection line formed on the hole varies to some extent, the interconnection line can be formed to overlap the hole. Accordingly, electrical connection between the interconnection line and a conductive region formed under the hole can surely be made.

According to one still further aspect of the invention regarding a semiconductor device, the semiconductor device includes a semiconductor substrate, and first and second conductive regions formed on the semiconductor substrate. The shortest distance across the shape in plan view of the first and second conductive regions each is equal to or less than the wavelength of the exposure light used in a photolithography process step for generating the conductive regions. The longest distance across the shape in plan view of the first and second conductive regions each is greater than the wavelength of the exposure light. The distance between the first and second conductive regions is equal to or less than the wavelength of the exposure light. In the photolithography process step for generating the first and second conductive regions, a mask having a pattern formed thereon for producing the first and second conductive regions is moved relatively to and in parallel with the semiconductor substrate to implement an exposure step.

The shortest distance across the conductive regions each is thus smaller than the wavelength of the exposure light, so that the number of conductive regions per unit area in the direction of the shortest distance can be increased compared with the conventional semiconductor device. The number of conductive regions per unit area can further be increased since the distance between the first and second conductive regions is equal to or less than the wavelength of the exposure light. As a result, the degree of integration of the semiconductor device can be improved.

The longest distance across the conductive region is thus greater than the wavelength of exposure light, so that when a contact hole, an interconnection line, or the like is formed on the conductive region, the contact hole or the like can be formed surely on the conductive region. Consequently, a problem such as defective connection or disconnection of lines due to mismatch of the positions of the conductive region and the contact, hole or the like can be prevented. Deterioration of electrical characteristics of the semiconductor device due to the defective connection or the like can be prevented accordingly.

Prevention of deterioration of electrical characteristics as swell as higher integration of the semiconductor device are thus possible.

According to the one still further aspect of the invention, the semiconductor device may further include an interconnection line formed on at least one of the first and second conductive regions and extending in a direction almost perpendicular to the longest distance across the holes each, and the longest distance may be greater than the sum of the line width of the interconnection line and the length of the margin of pattern position accuracy of the interconnection line.

In this case, even if the position of the interconnection line varies, the interconnection lines can surely be formed on the conductive region. As a result, prevention of defective connection due to mismatch of the positions of the interconnection line and the conductive region in the semiconductor device is surely possible. Deterioration of electrical characteristics of the semiconductor device due to the defective connection can be prevented accordingly.

The foregoing and other objects, features, aspects and advantages of the present invention will become more apparent from the following detailed description of the present invention while taken in conjunction with the accompanying drawings.

DESCRIPTION OF THE PREFERRED EMBODIMENTS

Embodiments of the present invention are hereinafter described in conjunction with the drawings.

(First Embodiment)

Figure 1:
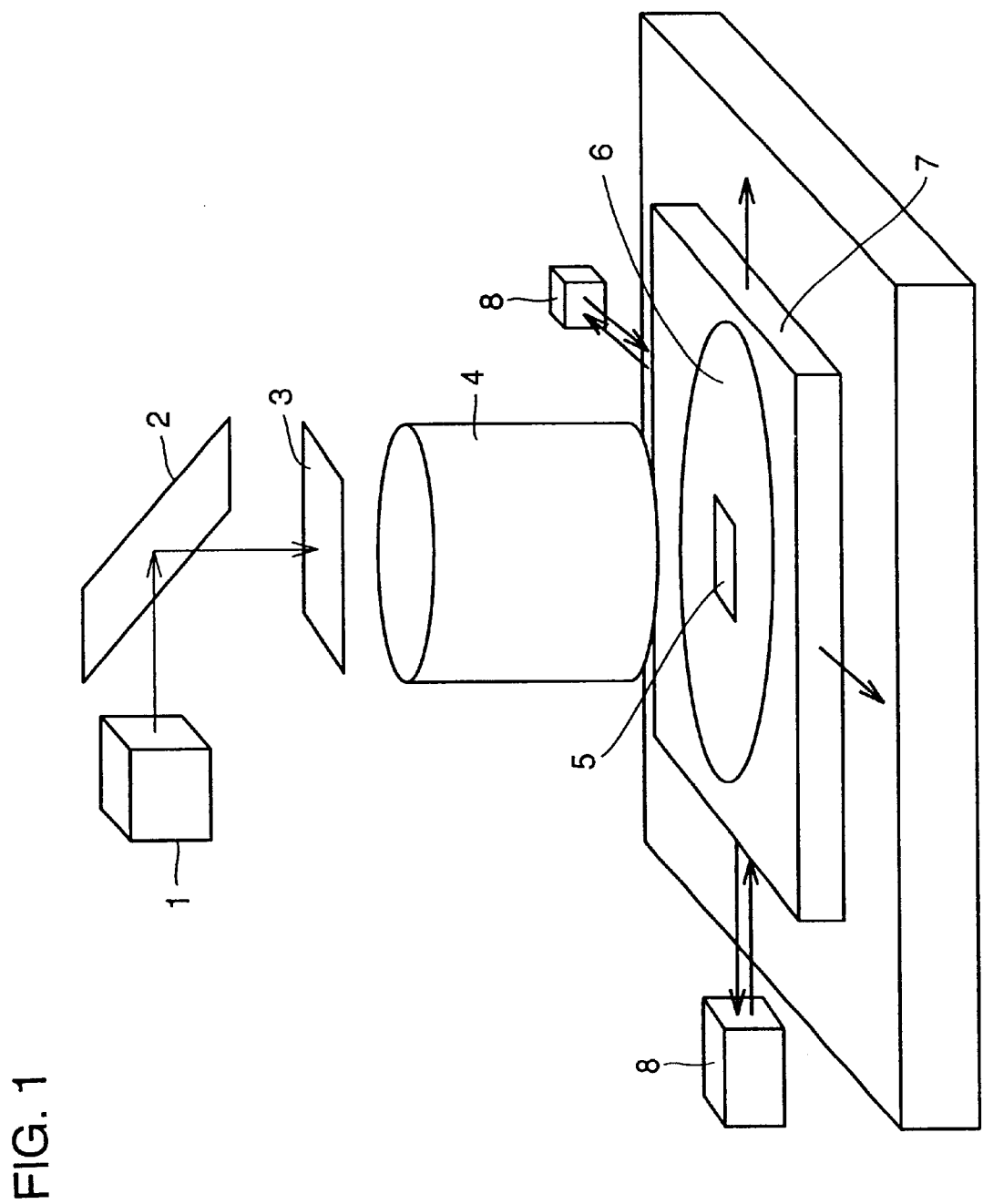
FIG. 1 illustrates an exposure system according to the first embodiment of the invention.

Referring to FIG. 1, an exposure system will be described in the following.

As shown in FIG. 1, the exposure system includes an exposure light source 1, a half mirror 2, a mask 3, a projection lens 4, an XY stage 7 where a semiconductor substrate 6 is located, and an interferometer 8. On XY stage 7, semiconductor substrate 6 is placed. XY stage 7 having semiconductor substrate 6 arranged thereon is movable in horizontal directions. The position of XY stage 7 can be measured by interferometer 8. Projection lens 4 is placed above XY stage 7. Mask 3 having a pattern to be transferred (transfer pattern) is formed thereon is placed above projection lens 4. Half mirror 2 is located above mask 3.

Exposure light generated at light source 1 proceeds through half mirror 2, mask 3, and projection lens 4 to reach a pattern formation region on a surface of semiconductor substrate 6 on which a resist film (not shown) is formed. The transfer pattern formed on mask 3 is projected onto pattern formation region 5.

Mercury lamp or excimer laser may be used as exposure light source 1. In the conventional exposure system, XY stage 7 and mask 3 are fixed in the exposure process to prevent the relative positions of those from shifting. On the other hand, the exposure system of the invention allows the position of XY stage 7 relative to mask 3 to change while exposure light is directed thereon as described below in conjunction with a method of forming a resist pattern. Alternatively, the position of the XY stage relative to mask 3 may slightly be changed after one exposure operation is completed, and then another exposure operation may be carried out.

The position of XY stage 7 at this time is correctly measured by interferometer 8. The method of forming a resist pattern of the invention described below can easily be implemented accordingly.

Although mask 3 is shown to be fixed and the position of XY stage 7 is changed relative to mask 3 in FIG. 1, XY stage 7 may be fixed to shift the position of mask 3 relative to semiconductor substrate 6 to achieve a similar effect.

Figure 2:
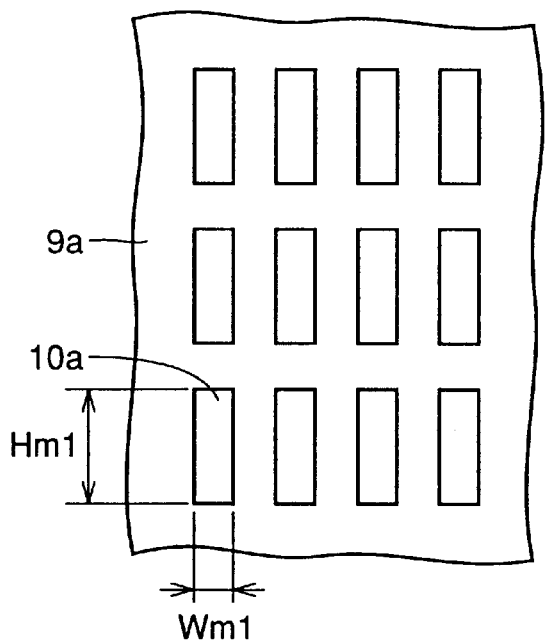
FIG. 2 illustrates a mask pattern used for a method of forming a resist pattern according to the first embodiment of the invention.

Referring next to FIG. 2, a mask pattern 10a is formed at a light-blocking film 9a.

Figure 3:
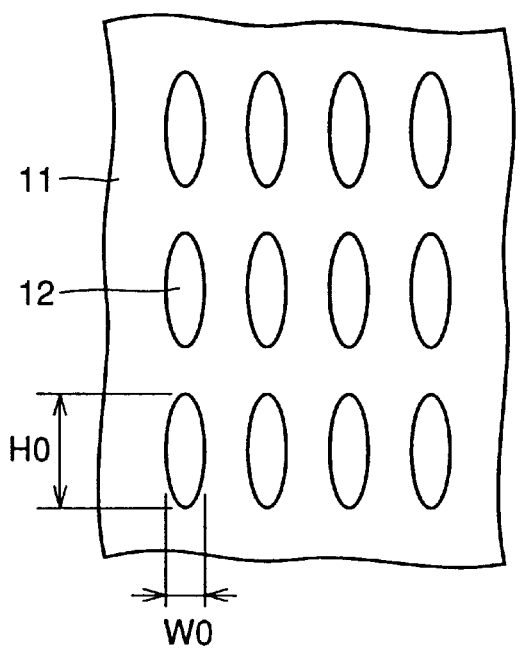
FIG. 3 illustrates a resist pattern to be generated by the method of forming a resist pattern according to the first embodiment of the invention.

FIG. 3 shows a resist pattern 12 to be formed as a hole pattern generated at a resist film 11 and having a width W0 and a height H0.

The width W0 of resist pattern 12 is smaller than the wavelength of light used for exposure. Suppose here that light from excimer laser is used as exposure light. The wavelength of the exposure light is 248 nm. The width W0 of resist pattern 12 is about 200 nm. Although the height H0 of resist pattern 12 varies depending on a semiconductor device to be fabricated, it is supposed to be two to three times larger than the width W0 of resist pattern 12.

The distance between any resist pattern 12 and a resist pattern adjacent thereto is smaller than the wavelength of the exposure light in both of the vertical and horizontal directions. As a result, the number of resist patterns 12 per unit area can be increased.

If an exposure system of the stepper type is used, a width Wm1 of mask pattern 10a shown in FIG. 2 is approximately five times larger than the width W0 of resist pattern 12 shown in FIG. 3. A height Hm1 of mask pattern 10a is also at least five times greater than the height H0 of resist pattern 12 (see FIG. 3).

If the excimer laser beam (wavelength: 248 nm) is used as the exposure light to make the hole pattern with the width W0 of about 200 nm as described above, a resist pattern illustrated in FIG. 4 is generated through exposure and development steps by using the mask pattern shown in FIG. 2 and following the conventional exposure method.

Figure 4:
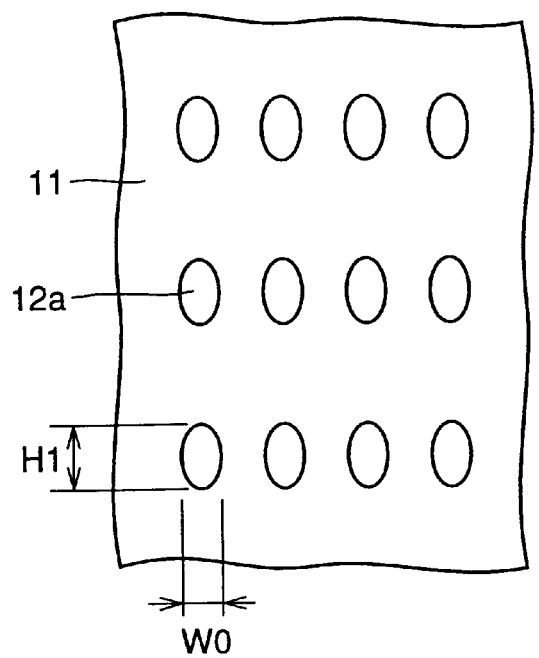
FIG. 4 illustrates a resist pattern formed by one exposure operation using the mask pattern shown in FIG. 2.

Although resist pattern 12a has the desired width W0 as shown in FIG. 4, a height H1 of resist pattern 12a is smaller than the required height H0 of resist pattern 12 (see FIG. 3).

Figure 5:
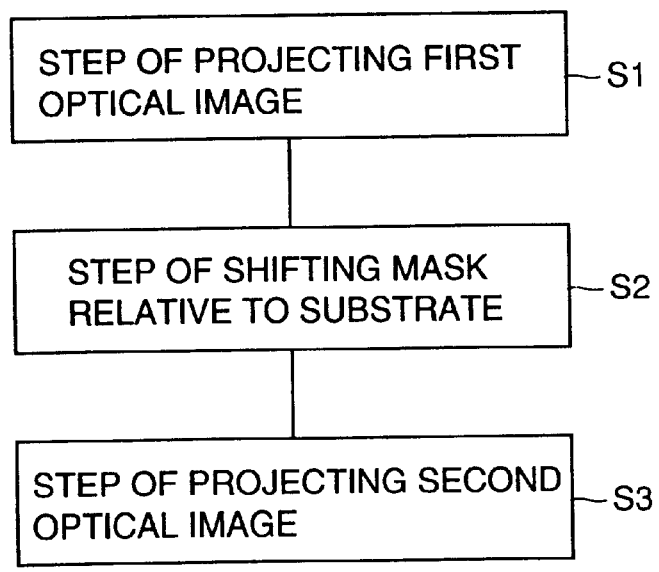
FIG. 5 illustrates a process flow of the method of forming a resist pattern according to tile first embodiment of the invention.
Figure 6:
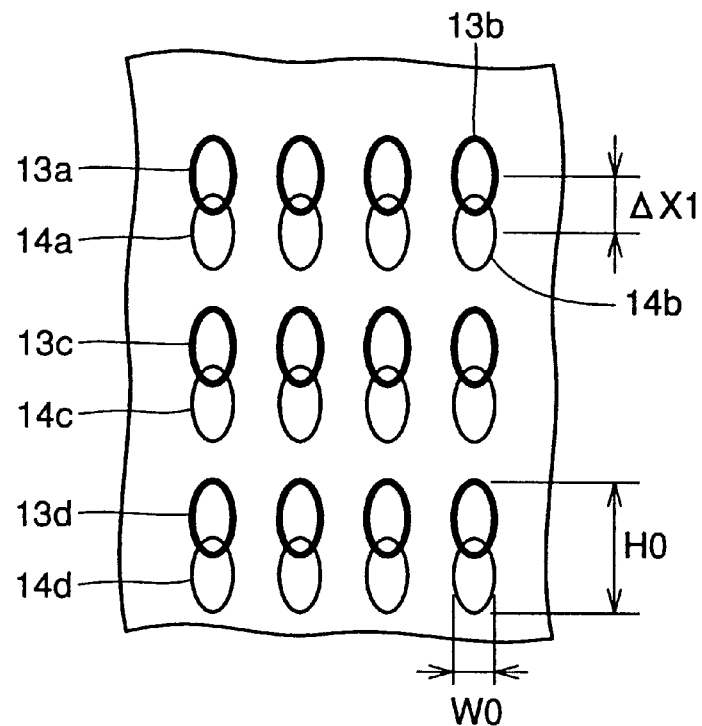
FIG. 6 is a plan view illustrating the method of forming a resist pattern shown in FIG. 5.

According to a method of forming a resist pattern of the invention, the steps as illustrated in FIG. 5 are performed. Referring to FIGS. 5 and 6, the method of forming a resist pattern is described below.

A positive resist is applied onto semiconductor substrate 6 (see FIG. 1). Semiconductor substrate 6 is placed at a prescribed position of XY stage 7 (see FIG. 1). Mask 3 (see FIG. 1) where the mask pattern shown in FIG. 2 is generated is placed in a mask holder. Referring to FIG. 5, the first exposure step corresponding to a step (S1) of projecting a first optical image is carried out. In this step, transfer patterns 13a to 13d constituting the first optical image are projected onto a resist film on semiconductor substrate 6 as shown in FIG. 6.

A step (S2) of shifting the mask relative to the substrate (see FIG. 5) is performed next. Specifically, XY stage 7 is shifted by A ΔXI with semiconductor substrate 6 fixed on XY stage 7. At this time, the position of mask 3 is fixed.

A step (S3) of projecting a second optical image (see FIG. 5) is performed next. Specifically, after XY stage is shifted by ΔX1, the second exposure operation is carried out using the same mask as that employed in the step (S1) of projecting the first optical image. As a result, transfer patterns 14a to 14d (see FIG. 6) are projected as the second optical image onto the resist film on the surface of semiconductor substrate 6. Transfer patterns 13a to 13d and 14a to 14d are projected to partially overlap with each other. Therefore, ΔX1 is preferably equal to or less than the height H1 (see FIG. 4) corresponding to the longest distance across each of transfer patterns 13a to 13d.

Referring to FIG. 6, the sum of the height of transfer patterns 13a to 13d each and that of transfer patterns 14a to 14d each is preferably adjusted to be equal to the height H0 (see FIG. 3) of resist pattern 12 to be generated. Further, the distance between transfer patterns (distance between transfer pattern 14c and transfer pattern 14d, for example) is preferably equal to or less than the wavelength of the exposure light.

Through the exposure steps and a subsequent development process, the resist pattern 12 as shown in FIG. 3 can be produced easily. More specifically, although one exposure step merely generates the pattern as shown in FIG. 4, the method of forming a resist pattern according to the invention enables resist pattern 12 (see FIG. 3) to precisely be generated as a long and narrow hole pattern having the width W0 corresponding to the shortest, distance which is smaller than the wavelength of light used for the exposure and the height H0 corresponding to the longest distance which is greater than the wavelength of light used for the exposure, by several exposure steps. Further, the number of resist patterns per unit area can be increased since the distance between resist patterns can be made equal to or less than the wavelength of the exposure light.

Although the exposure step is repeated two times in this embodiment, the exposure step may be repeated three times or more to achieve a similar effect. Increased number of the exposure steps makes it possible to generate a long and narrow resist pattern 12 having a greater height H0.

Resist pattern 12 having the width W0 smaller than the wavelength of light used for the exposure can thus be formed as described above. Therefore, if contact holes are produced by using such resist pattern 12, the degree of integration of the contact holes can be enhanced in the direction of the width W0 of resist pattern 12. Consequently, a semiconductor device achieving higher integration can be manufactured.

Adjustment to distance ΔX1 and direction by and in which mask 3 is shifted relative to semiconductor substrate 6 enables resist pattern 12 to be produced with an arbitrary shape.

Figure 7:
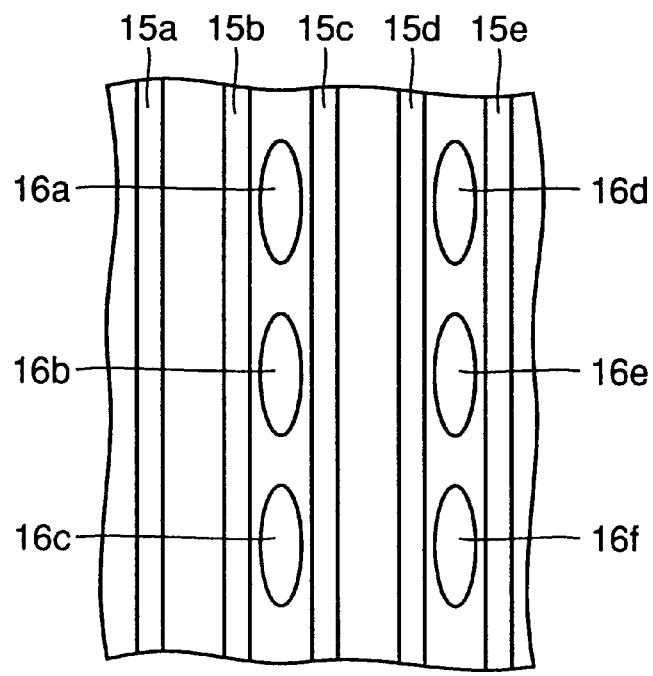
FIGS. 7 and 8 are plan views respectively illustrating the first and second steps of a method of manufacturing a semiconductor device according to the first embodiment of the invention.
Figure 8:
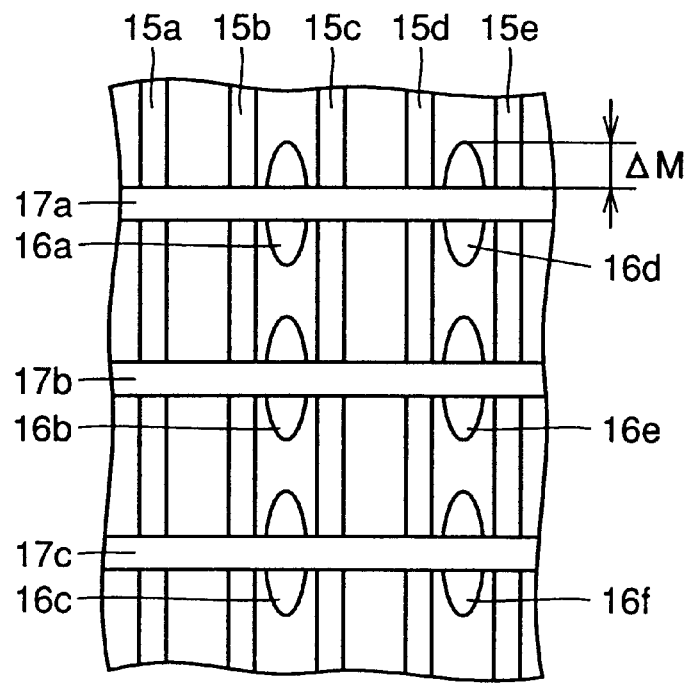

Referring to FIGS. 7 and 8, a method of manufacturing a semiconductor device is next described.

A conductive region is first formed at a main surface of a semiconductor substrate (not shown). Lower-level interconnection lines 15a to 15e are formed on the main surface of the semiconductor substrate. An interlayer insulating film (not shown) is formed on lower-level interconnection lines 15a to 15e. A positive resist (not shown) is applied onto the interlayer insulating film. In accordance with the method of forming a resist pattern of the invention shown in FIG. 5, a resist pattern shown as the hole pattern in FIG. 3 is generated at the resist film. Using the resist pattern as a mask, the interlayer insulating film is etched away. The resist pattern is thereafter removed. Contact holes 16a to 16f are accordingly formed in the interlayer insulating film such that they are positioned between lower-level interconnection lines 15a to 15e as shown in FIG. 7.

The spacing between lower-level interconnection lines 15a to 15e is approximately equal to or smaller than the wavelength of light used for the exposure. Further, direct contact between contact holes 16a to 16f and lower-level interconnection lines 15a to 15e must be avoided. Therefore, the width of contact holes 16a to 16f each corresponding to the shortest distance thereof should sufficiently be smaller than the wavelength of light for the exposure. In addition, the distance between contact holes 16a and 16b is equal to or less than the wavelength of the exposure light. In both of the vertical and horizontal directions, the distance between hole 16a and another hole may be equal to or less than the wavelength of the exposure light. Accordingly, the degree of integration of the semiconductor device can be enhanced.

On the other hand, upper-level interconnection lines should be formed surely on contact holes 16a to 16f since contact holes 16a to 16f are used for ensuring electrical connection between the upper-level interconnection lines and the conductive region located between lower-level interconnection lines 15a to 15e. In this case, if the positions of contact holes 16a to 16f and the upper-level interconnection lines do not match due to the difference in the pattern position accuracy of the upper-level interconnection lines, the electrical connection between the upper-level interconnection lines and the underlying conductive region could not be ensured. In order to avoid this, the height of contact holes 16a to 16f each corresponding to the longest distance thereof should have enough dimension considering the overlying interconnection lines and the pattern position accuracy margin (tolerance) thereof. Therefore, contact holes 16a to 16f are shaped as ellipses as illustrated in FIG. 7.

Referring to FIG. 8, upper-level interconnection lines 17a to 17c are formed on the interlayer insulating film and in contact holes 16a to 16f. The longest distance of contact holes 16a to 16f each is determined by considering a margin ΔM of the pattern position accuracy and the line width of upper-level interconnection lines 17a to 17c each. Accordingly, upper-level interconnection lines 17a to 17c can be formed surely on contact holes 16a to 16f, and therefore, upper-level interconnection lines 17a to 17c can be in electrical contact with the underlying conductive region without fail. Defective connection which causes upper-level interconnection lines 17a to 17c not to be connected to the underling conductive region can be prevented that results from mismatch of the positions of upper-level interconnection lines 17a to 17c and contact holes 16a to 16f. Further, the width of contact holes 16a to 16f each corresponding to the shortest distance across the contact hole can be made smaller than the wavelength of light for the exposure, so that the number of semiconductor elements can be increased in the direction of the width of contact holes 16a to 16f compared with the conventional device. Consequently, higher integration of a semiconductor device is achieved while deterioration of electrical characteristics thereof is avoided.

Description of a semiconductor device is given below according to FIG. 9.

Figure 9:
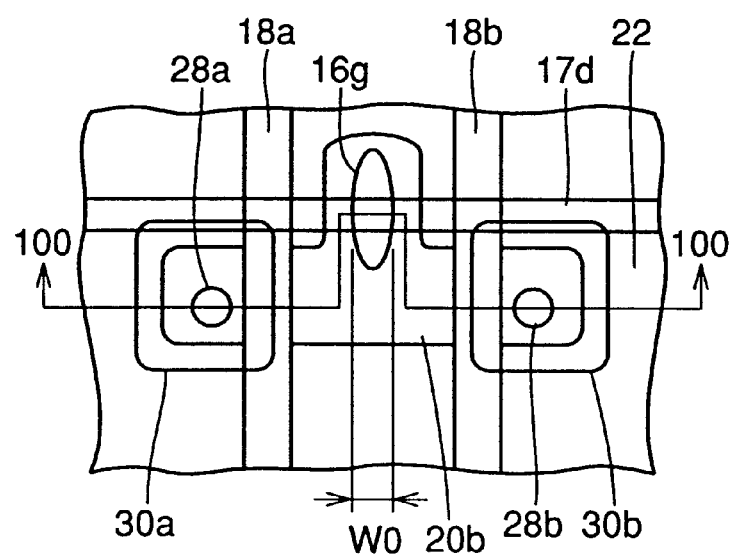
FIG. 9 is a plan view illustrating a semiconductor device according to the first embodiment of the invention.

Referring to FIG. 9, the semiconductor device includes a source/drain legion 20b formed at a main surface of a semiconductor substrate and surrounded by an isolation insulating film 22, gate electrodes 18a and 18b, a capacitor halting capacitor lower electrodes 30a and 30b, and a bit line 17d. Bit line 17d is electrically connected with source/drain region 20b via a contact hole 16g. Contact hole 16g is formed by the method of forming a resist pattern of the invention shown in FIG. 5 to have a two-dimensional shape which is similar to an ellipse. The width W0 of contact hole 16g is smaller than the wavelength of the exposure light used in the manufacturing process of the semiconductor device.

A cross-sectional structure of the semiconductor device is described below according to FIG. 10.

Figure 10:
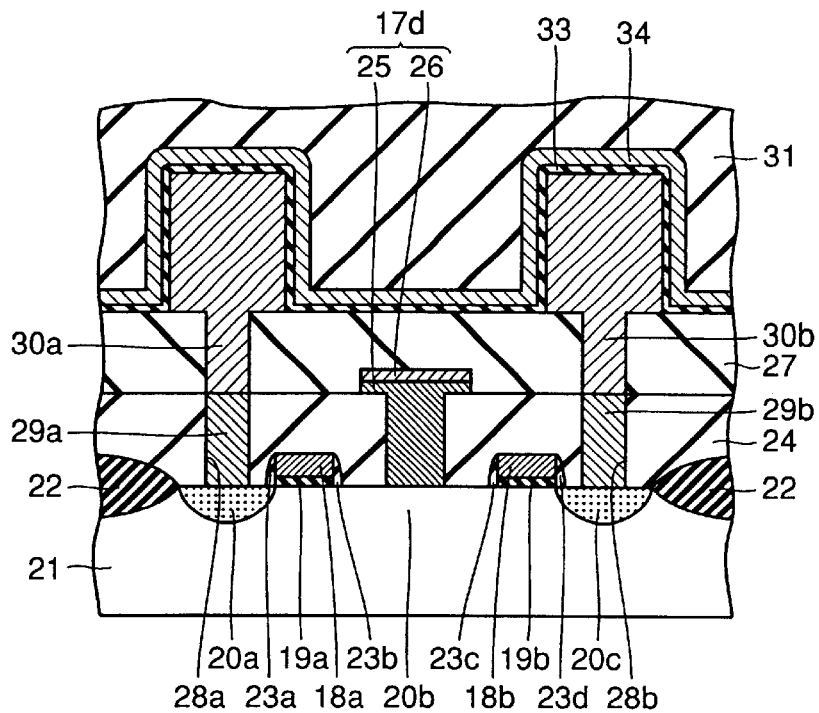
FIG. 10 is a cross sectional view along line 100—100 of the semiconductor device shown in FIG. 9.

Referring to FIG. 10, isolation insulating film 22 is formed at the main surface of semiconductor substrate 21. In a region surrounded by isolation insulating film 22, source/drain regions 20a to 20c are formed at the main surface of semiconductor substrate 21. Source/drain regions 20a to 20c are arranged to be adjacent to each other via channel regions. On the channel regions, gate electrodes 18a and 18b are formed on the main surface of semiconductor substrate 21 via gate insulating films 19a and 19b. Sidewall oxide films 23a to 23d are formed on the side surfaces of gate electrodes 18a and 18b and gate insulating films 19a and 19b. A first interlayer insulating film 24 is formed on gate electrodes 18a and 18b and on sidewall oxide films 23a to 23d.

In a region of interlayer insulating film 24 located on source/drain region 20b, contact hole 16g is generated. A polysilicon film 25 is formed on interlayer insulating film 24 and in contact hole 16g. A tungsten polysilicon film 26 is formed on polysilicon film 25. Bit line 17d is formed of polysilicon film 25 and tungsten silicide film 26.

A second interlayer insulating film 27 is formed on interlayer insulating film 24 and bit line 17d. In regions located on source/drain regions 20a and 20c, contact holes 28a and 28b are generated in the first and second interlayer insulating films 24 and 27. Plugs 29a and 29b are formed in contact holes 28a and 28b. Capacitor lower electrodes 30a and 30b are formed on plugs 29a and 29b.

Dielectric films 33a and 33b are formed on capacitor lower electrodes 30a, and 30b. A capacitor upper electrode 34 is formed on dielectric films 33a and 33b. A third interlayer insulating film 31 is deposited on the capacitor upper electrode 34.

Contact hole 16g for connecting source/drain region 20b with bit line 17d is shaped into the ellipse as shown in FIG. 9 according to the method of forming a resist pattern of the invention, so that bit line 17d and source/drain region 20b are surely connected.

Since the width W0 of contact hole 16g is smaller than the wavelength of light for the exposure, the spacing between gate electrodes 18a and 18b can be made smaller compared with the conventional device. Consequently, the semiconductor device achieves higher integration.

Figure 11:
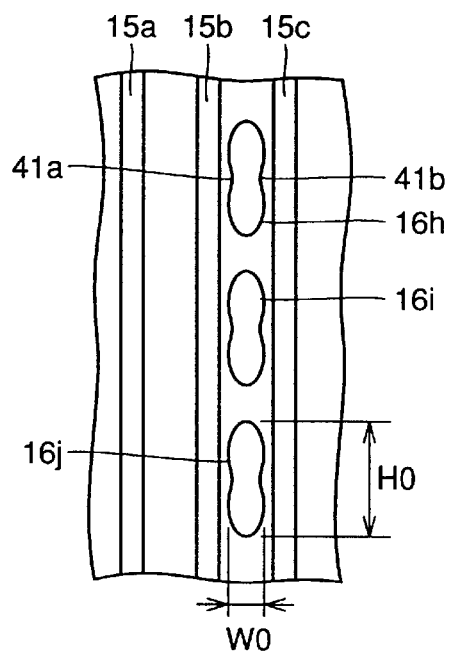
FIG. 11 is a plan view illustrating a method of manufacturing a semiconductor device according to a modification of the first embodiment.

Although the contact hole produced by the method of forming a resist pattern of the invention has the elliptical shape in the example above, contact holes 16h to 16j shown in FIG. 11 having concave portions 41a and 41b on the perimeter of its two-dimensional shape can be generated by selecting the shapes of the first, and second transfer patterns 13a to 13d and 14a to 14d (see FIG. 6) and the value of ΔX1.

In this case, the width W0 and the height H0 of contact holes 16h to 16j each are also respectively smaller and sufficiently greater than the wavelength of light for the exposure.

A semiconductor device provided with such contact holes 16h to 16j also achieves an effect similar to that of the semiconductor device of the first embodiment of the invention shown in FIGS. 9 and 10.

(Second Embodiment)

Figure 12:
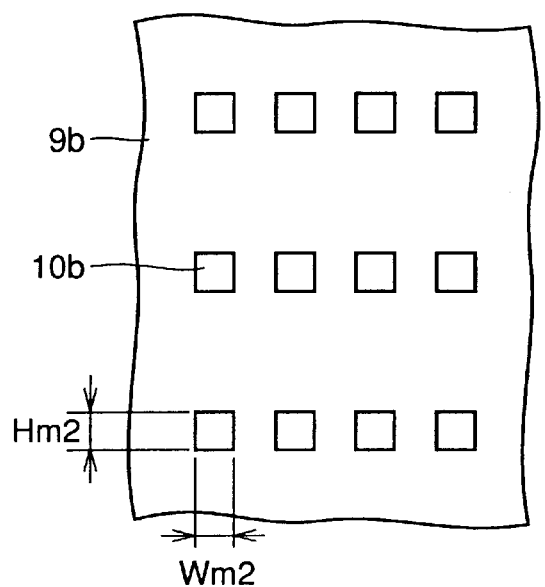
FIG. 12 illustrates a mask pattern used for a method of forming a resist pattern according to the second embodiment of the invention.

Referring to FIG. 12, a mask pattern 10b is formed at a light-blocking film 9b with a width of Wm2 and a height of Hm2. The width Wm2 is equivalent to the width Wm1 (see FIG. 2) of the mask pattern used in the first embodiment. The height Hm2 of mask pattern 10b is smaller than the height Hm1 of mask pattern 10a used in the first embodiment.

A method of forming a resist pattern in the second embodiment of the invention uses mask pattern 10b shown in FIG. 12. The method of forming a resist pattern of the second embodiment is basically similar to that of the first embodiment. A difference is that, in the method of forming a resist pattern according to the second embodiment, exposure light is emitted in the step (S2) of shifting the mask relative to the substrate shown in FIG. 5. Therefore, the exposure operation is continued from the step of projecting the first optical image (S1) to the step of projecting the second optical image (S3).

Figure 13:
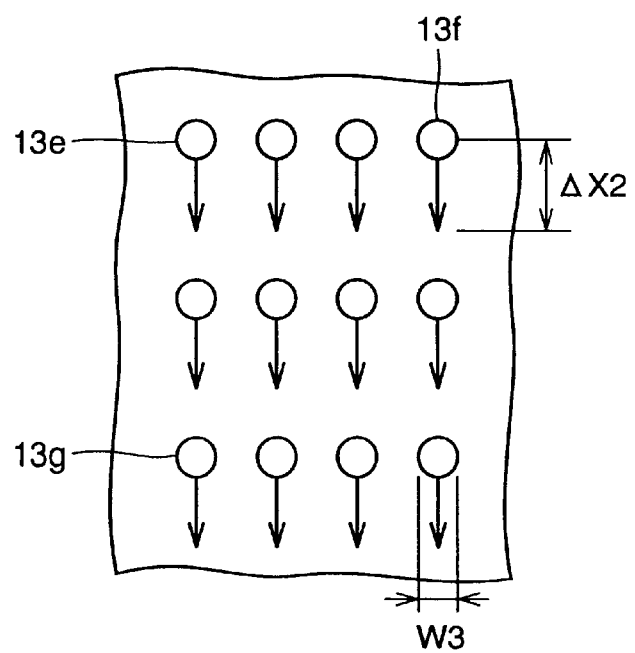
FIG. 13 illustrates the method of forming a resist pattern according to the second embodiment of the invention.

Referring to FIG. 13, the method of forming a resist pattern is described according to the second embodiment of the invention.

As the step of projecting the first optical image (S1), exposure is performed using the mask pattern illustrated in FIG. 12 similarly to the first embodiment. Transfer patterns 13e to 13g are then projected onto a resist film.

The exposure is continued in the step of shifting the mask relative to the substrate (S2). In this step XY stage 7 is shifted by ΔX2. A width W3 of transfer patterns 13e to 13g each is equivalent to the width W0 of transfer patterns 13a to 13d each of the first embodiment.

A long and narrow resist pattern having a two-dimensional shape where two sides are almost parallel with each other can be generated by a development process after the exposure process. A method of manufacturing a semiconductor device using such a resist pattern is described by using FIG. 14.

Figure 14:
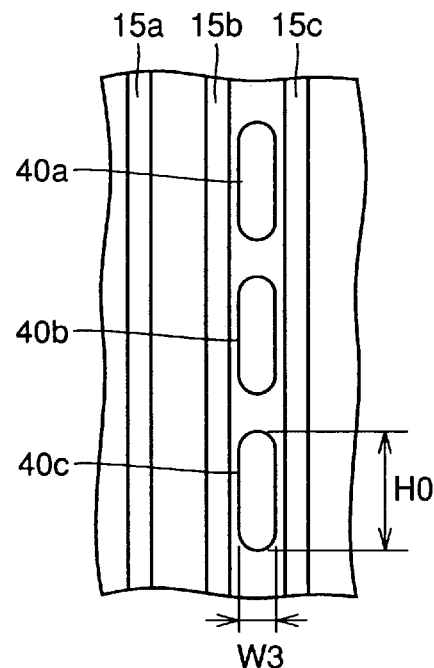
FIG. 14 is a plan view illustrating a method of manufacturing a semiconductor device according to the second embodiment of the invention.

Referring to FIG. 14, the method of manufacturing a semiconductor device of the second embodiment is basically similar to that of the first embodiment illustrated in FIG. 7. A difference is that contact holes 40a to 40c accordingly generated each have a two-dimensional shape where two sides are almost parallel with each other. The reason is that XY stage 7 where semiconductor substrate 6 is fixed is shifted by ΔX2 in the direction of the height H0 of contact holes 40a to 40c while the exposure operation is carried out. It is noted that the distance between contact holes 40a and 40b is equal to or less than the wavelength of the exposure light.

Through the steps similar to those of the method of manufacturing a semiconductor device of the first embodiment illustrated in FIG. 8, the semiconductor device is obtained. The method of manufacturing a semiconductor device according to the second embodiment also achieves an effect similar to that of the method of manufacturing a semiconductor device according to the first embodiment.

The method of forming a resist pattern by which the XY stage is shifted while the exposure operation proceeds is more advantageous when it is applied to an exposure system of the scan type.

Some of the latest steppers move mask 3 following the movement of XY stage 7 having a semiconductor substrate fixed thereto in order to prevent the relative positions of semiconductor substrate 6 and mask 3 from changing. By controlling the position of mask 3 such that mask 3 moves relatively to semiconductor substrate 6, such exposure systems achieve a similar effect.

(Third Embodiment)

Description of a semiconductor device is given below by using FIG. 15.

Figure 15:
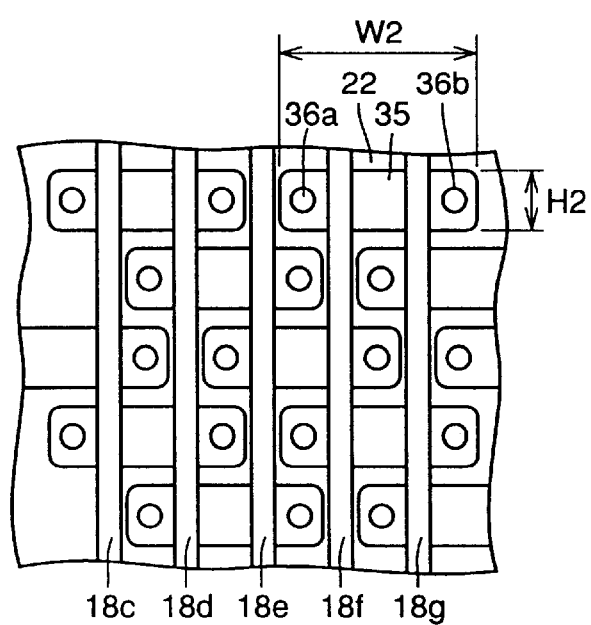
FIG. 15 is a plan view of a semiconductor device according to the third embodiment of the invention.

Referring to FIG. 15, a conductive region 35 surrounded by an isolation insulating film 22 is formed at a main surface of a semiconductor substrate (not shown). Gate electrodes 18c to 18g are formed on conductive region 35 and isolation insulating film 22. Conductive region 35 is electrically connected to a capacitor lower electrode (not shown) via contact holes 36a and 36b. A region of conductive region 35 located between gate electrodes 18f and 18g is electrically connected to a bit line (not shown) via a contact hole (not shown). A height H2 of conductive region 35 is smaller than the wavelength of exposure light used in a photolithography process for generating conductive region 35. A width W2 of conductive region 35 is sufficiently larger than the wavelength of the exposure light.

The height H2 of conductive region 35 smaller than the wavelength of the exposure light enables conductive regions 35 to be produced more thickly in the direction of the height H2 compared with the conventional device. As a result, higher integration of the semiconductor device is achieved.

The width W2 is defined to be larger than the wavelength of the exposure light such that the margin of pattern position accuracy of gate electrodes 18f and 18g as well as the margin of the position accuracy of contact holes 36a and 36b are taken into account. Accordingly, problems of defective connection and wire disconnection in a circuit of the semiconductor device due to positional mismatch between gate electrode 18f and contact holes 36a and 36b can be prevented. Deterioration of electrical characteristics of the semiconductor device due to such defective connection and the like can thus be avoided.

In both of the vertical and horizontal directions, the distance between conductive region 35 and another conductive region is equal to or less than the wavelength of the exposure light.

Prevention of the deterioration of electrical characteristics as well as enhanced integration of the semiconductor device are accordingly achieved.

Figure 16:
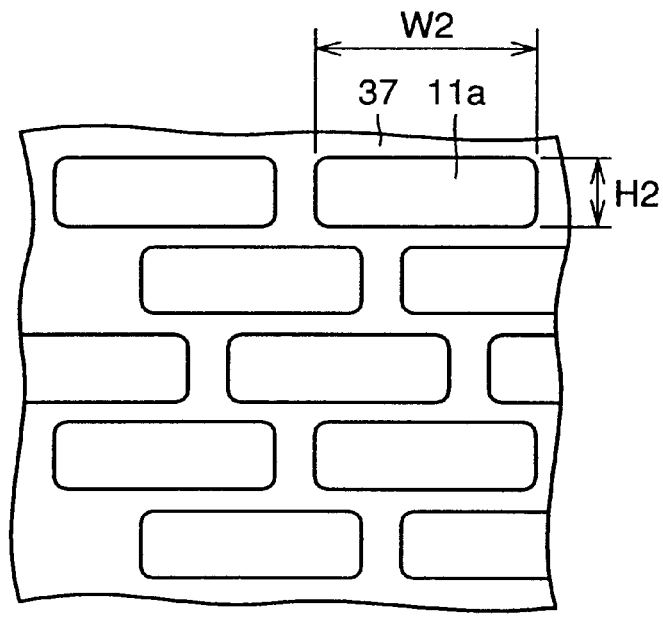
FIG. 16 is a plan view of a resist pattern used for fabricating the semiconductor device shown in FIG. 15.

In order to generate conductive region 35 as shown in FIG. 15. a resist pattern 11a should be formed on a semiconductor substrate 37 as show n in FIG. 16. Referring to FIG. 16, resist pattern 11a has a height H2 and a width W2 equivalent to the height H2 and width W2 of conductive region 35 shown in FIG. 15.

The method of forming a resist pattern of the invention is effective when such resist pattern 11a is to be generated. Details are given below.

Figure 17:
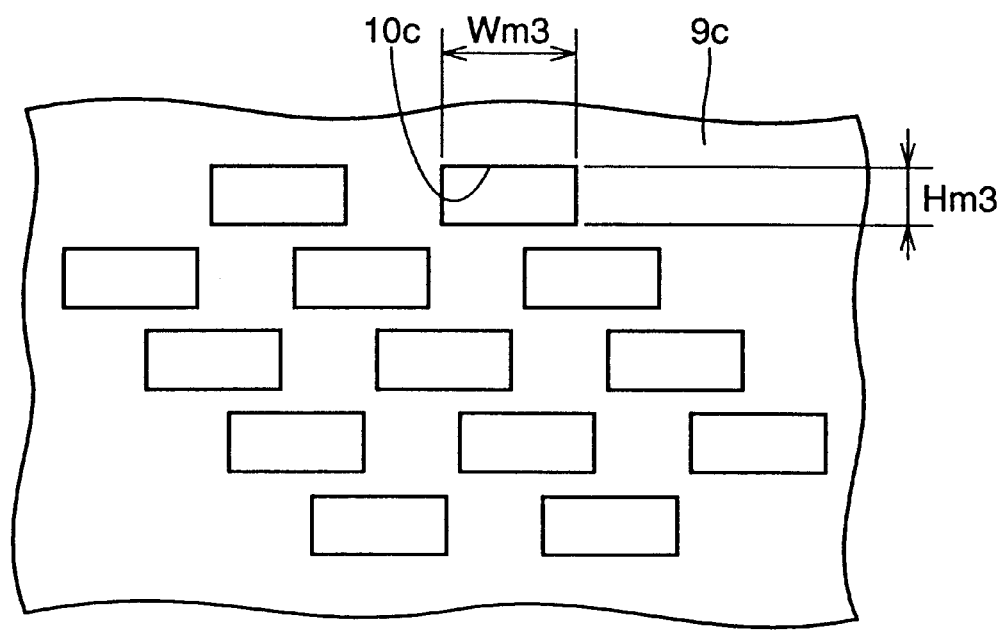
FIG. 17 illustrates a mask pattern used for a method of forming a resist pattern according to the third embodiment of the invention.

Referring to FIG. 17, a mask pattern 10c having a height Hm3 and a width Wm3 is formed at a light-blocking film 9c. The method of forming a resist pattern of the third embodiment using such a mask pattern includes the following steps.

A negative resist is first applied onto a surface of a semiconductor substrate 6 (see FIG. 1). A semiconductor substrate 6 is next placed at an XY stage 7 (see FIG. 1) of an exposure system similarly to the method of forming a resist pattern of the first embodiment. A mask 3 having the mask pattern illustrated in FIG. 17 is placed at the exposure system. The steps similar to those of the resist pattern formation method of the first embodiment illustrated in FIG. 5 are carried out.

Figure 18:
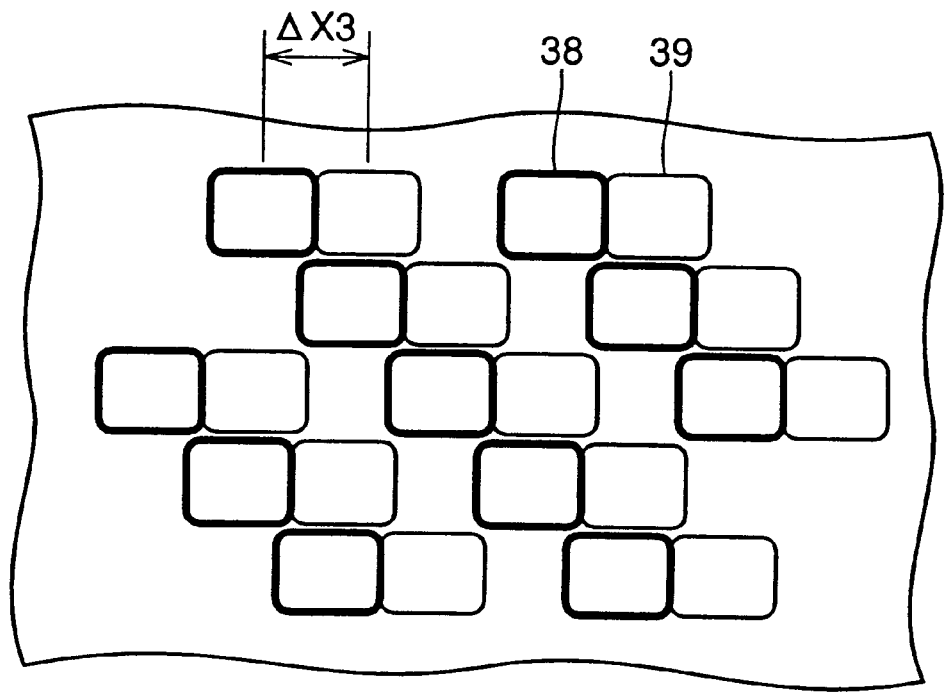
FIG. 18 is a plan view illustrating the method of forming a resist pattern according to the third embodiment of the invention.

Specifically, a first exposure step corresponding to the step of projecting a first optical image (S1, see FIG. 5) is performed. Consequently, a first transfer pattern 38 is projected onto a resist film on the surface of semiconductor substrate 6 as shown in FIG. 18.

A step corresponding to the step of shifting the mask relative to the substrate (S2) is next performed in which XY stage 7 is shifted by ΔX3 while semiconductor substrate 6 is fixed on XY stage 7. The position of mask 3 is fixed as in the resist pattern formation method of the first embodiment.

After the XY stage is shifted, a second exposure step corresponding to the step of projecting the second optical image (S3, see FIG. 5) is carried out. A second transfer pattern 39 is thus projected onto the resist film.

Through a development process, resist pattern 11a illustrated in FIG. 16 is thus easily obtained.

Preferably, the distance ΔX3 by which the XY stage is shifted is equal to or smaller than the width of transfer patterns 38 and 39 each. By such an arrangement, the first and second transfer patterns 38 and 39 partially overlap with each other, and consequently, rectangular resist pattern 11a (see FIG. 16) can surely be generated.

Rectangular resist, pattern 11a having the shorter side smaller than the wavelength of exposure light and the longer side greater than the wavelength of exposure light, which is difficult to generate by the conventional one exposure step, can thus be produced precisely.

Although the exposure step is performed two times in this embodiment, at least three exposure steps allow resist pattern 11a to have longer width W2. Resist pattern 11a having an arbitrary shape is accordingly obtained.

Figure 19:
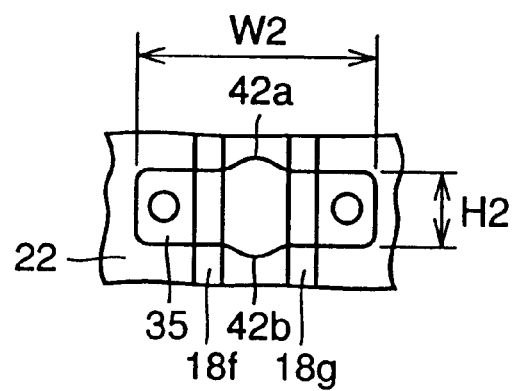
FIG. 19 is a plan view illustrating a semiconductor device according to a modification of the third embodiment of the invention.

Referring to FIG. 19, although a semiconductor device basically has a structure similar to that illustrated in FIG. 15 except that a conductive region 35 has protruded portions 42a and 42b partially on its perimeter. This structure can be obtained by adjusting the overlapped region of the first and second transfer patterns 38 and 39, changing the shape of the mask pattern, or by like methods. The semiconductor device having conductive region 35 with such a shape also achieves an effect similar to that of the semiconductor device shown in FIG. 15.

(Fourth Embodiment)

A method of forming a resist pattern according to the fourth embodiment is basically similar to that of the third embodiment. A difference is that, according to the method of forming a resist pattern of the fourth embodiment, exposure light is emitted in a step corresponding to the step of shifting the mask relative to the substrate (S2, see FIG. 5). As a result, an optical image which appears to be generated by parallel displacement of a transfer pattern 38a following the movement of an XY stage 7 is projected onto a resist film formed oil a semiconductor substrate 6 as illustrated in FIG. 20.

Figure 20:
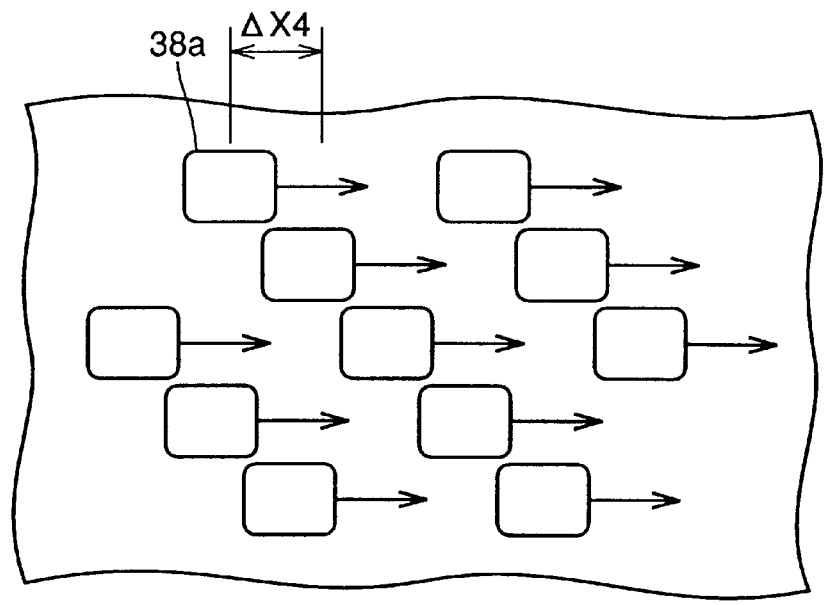
FIG. 20 is a plan view illustrating a method of forming a resist pattern according to the fourth embodiment of the invention.
Figure 21:
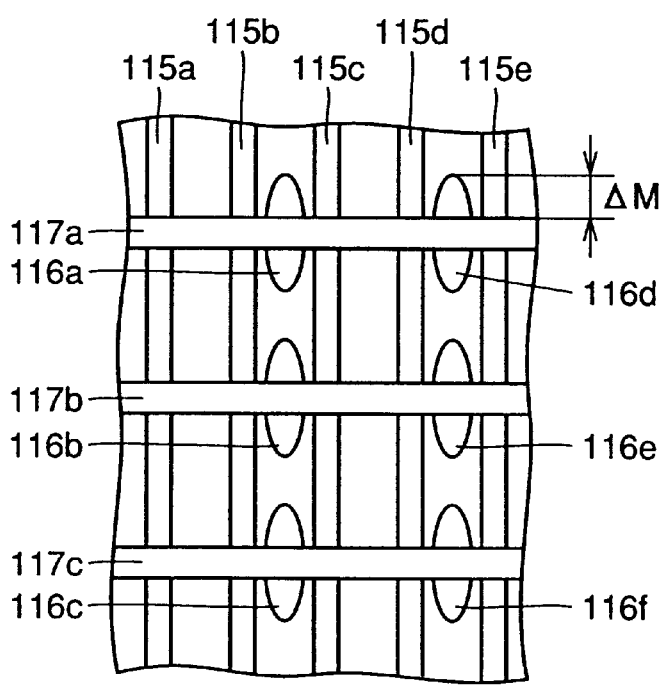
FIG. 21 is a plan view illustrating a semiconductor device associated with the invention.
Figure 22:
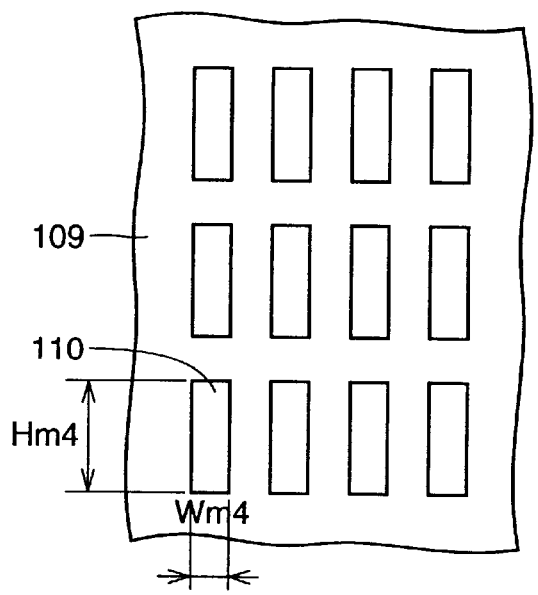
FIG. 22 illustrates a mask pattern in the prior art used for making contact holes 116a to 116f shown in FIG. 21.
Figure 23:
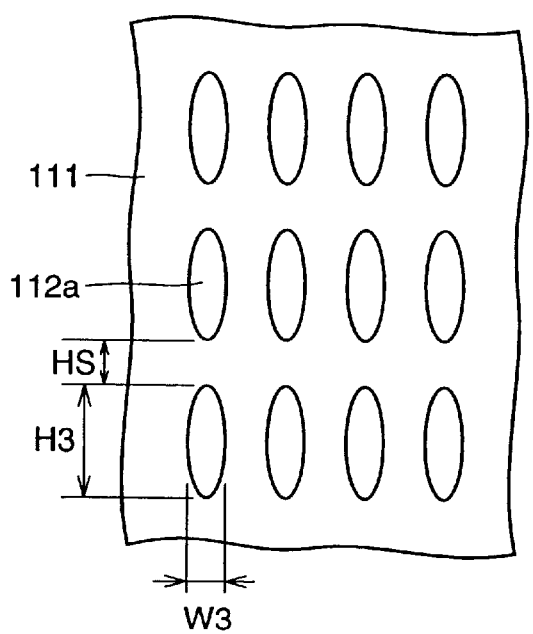
FIG. 23 illustrates a resist pattern in the prior art generated using the mask pattern shown in FIG. 22.
Figure 24:
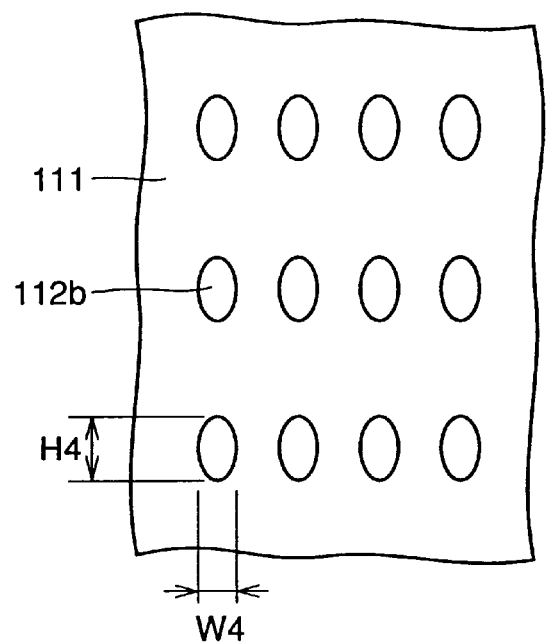
FIG. 24 illustrates a resist pattern formed by using the mask pattern shown in FIG. 22 when the shortest distance of the resist pattern is smaller than the wavelength of exposure light.
Figure 25:
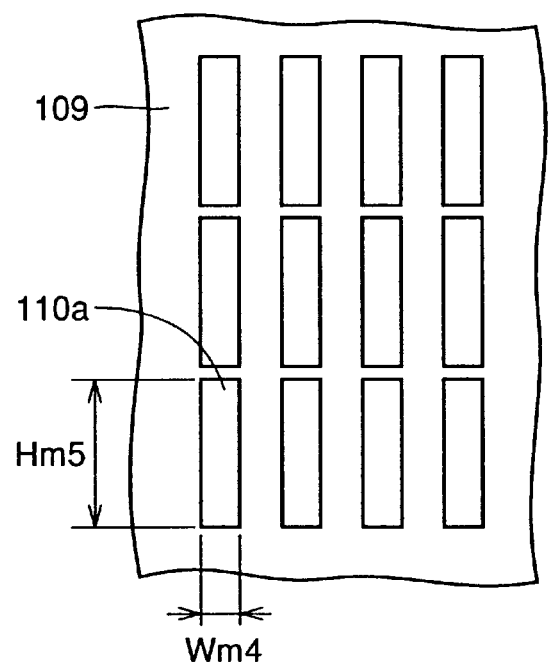
FIG. 25 illustrates another mask pattern associated with the invention.
Figure 26:
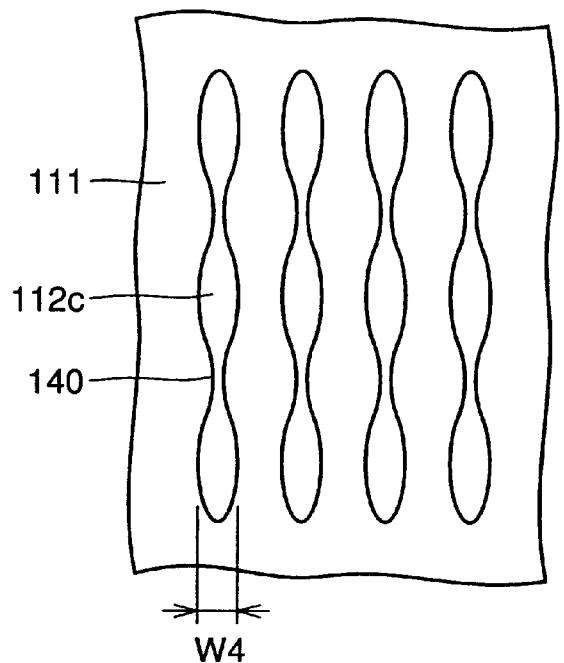
FIG. 26 illustrates a resist pattern generated by using the mask pattern shown in FIG. 25.
Figure 27:
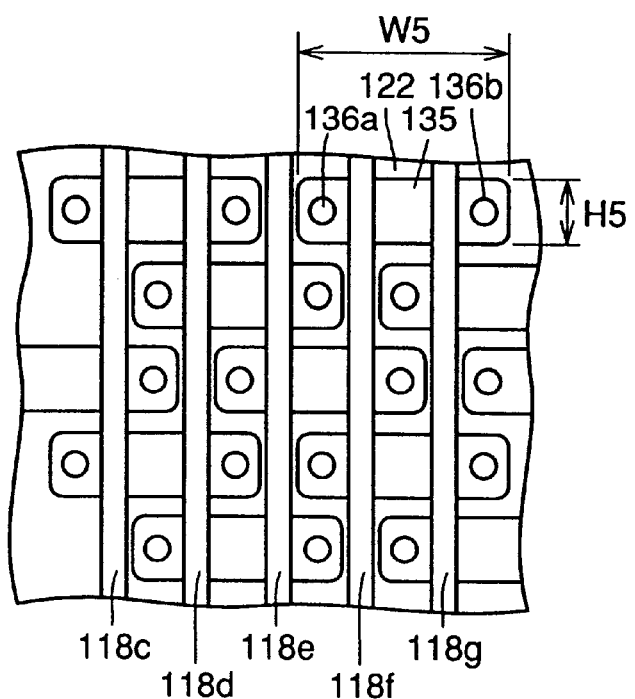
FIG. 27 is a plan view of a semiconductor device associated with the invention.
Figure 28:
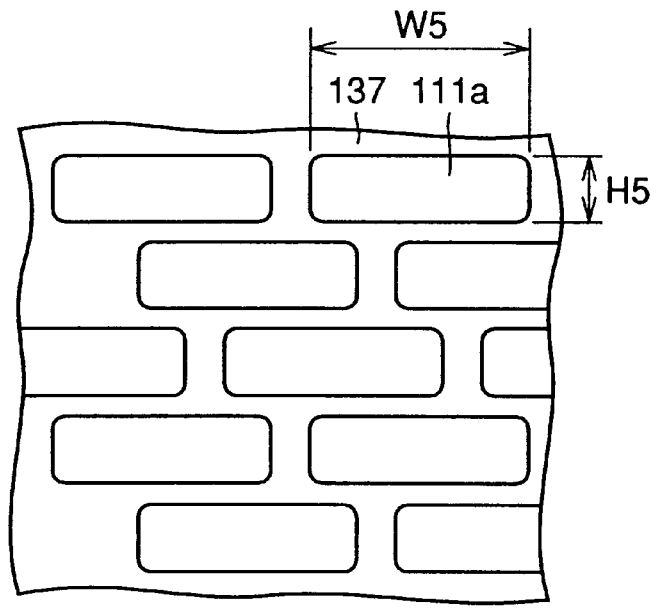
FIG. 28 illustrates a resist pattern which is necessary for fabricating the semiconductor device shown in FIG. 27.
Figure 29:
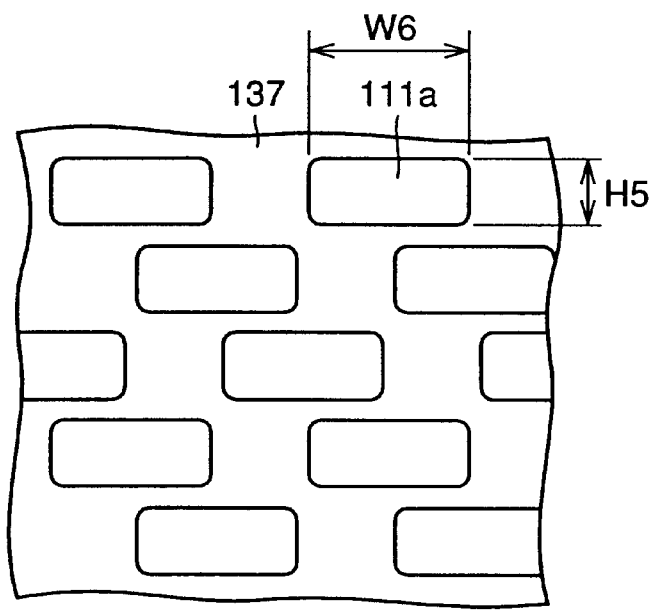
FIG. 29 illustrates a resist pattern generated when the shortest distance of the resist pattern is smaller than the wavelength of exposure light.

Referring to FIG. 20, ΔX4 represents the distance by which XY stage 7 is shifted. Through a development process after such an exposure process, resist pattern 11a as shown in FIG. 16 is obtained easily similarly to the third embodiment. An effect similar to that of the methods of forming a resist pattern of the second and third embodiments is accordingly achieved.

Some of the latest steppers move mask 3 in accordance with the movement of XY stage 7 where semiconductor substrate 6 is fixed, in order to prevent relative positions of mask 3 and semiconductor substrate 6 from changing. Such steppers provide a similar effect by moving mask 3 relative to XY stage 7.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a resist pattern comprising the steps of:

directing light via a mask onto a resist film formed on a substrate to project a first optical image having a width equal to or less than the wavelength of said light onto a surface of said resist film;

shifting said substrate relative to said mask;

directing light via said shifted mask onto the surface of said resist film to project a second optical image having a width equal to or less than the wavelength of said light onto the surface of said resist film, the optical image partially overlapping with a region where said first optical image is projected, and developing the resist film to form the resist pattern, wherein the first and second optical images include a plurality of resist pattern segments arranged with space therebetween.

2. The method of forming a resist pattern according to claim 1, wherein said step of shifting said substrate relative to said mask includes a step of directing light via said mask onto the surface of said resist film while shifting said substrate relative to said mask.

3. The method of forming a resist pattern according to claim 2, wherein developing the resist film generates a resist pattern having a width equal to or less than the wavelength of said light in regions where said first and second optical images are respectively projected and a region where said first and second optical images are projected to overlap with each other, wherein a length of said resist pattern in a direction substantially perpendicular to the direction of said width is grater than the wavelength of said light.

4. The method of forming a resist pattern according to claim 3, wherein said resist film is a positive resist film.

5. The method of forming a resist pattern according to claim 4, wherein said resist pattern is a hole pattern.

6. The method of forming a resist pattern according to claim 5, wherein a two-dimensional shape of said hole pattern is substantially elliptical.

7. The method of forming a resist pattern according to claim 3, wherein said resist film is a negative resist film.

8. The method of forming a resist pattern according to claim 7, wherein said resist pattern is used for forming a conductive region.

9. The method of forming a resist pattern according to claim 5 wherein a two-dimensional shape of said hole pattern is substantially rectangular.

10. A method of manufacturing a semiconductor device using the method of forming a resist pattern according to claim 3.

11. A semiconductor device fabricated by the method of manufacturing a semiconductor device according to claim 10.

12. The method of forming a resist pattern according to claim 1, wherein developing the resist film generates a resist pattern having a width equal to or less than the wavelength of said light in regions where said first and second optical images are projected to overlap with each other, wherein a length of said resist pattern in a direction substantially perpendicular to the direction of said width is grater than the wavelength of said light.

13. The method of forming a resist pattern according to claim 12, wherein said resist film is a positive resist film.

14. The method of forming a resist pattern according to claim 13, wherein said resist pattern is a hole pattern.

15. The method of forming a resist pattern according to claim 12, wherein said resist film is a negative resist film.

16. The method of forming a resist pattern according to claim 15, wherein said resist pattern is used for forming a conductive region.

* * * * *